United States Patent
Sun et al.

(10) Patent No.: US 10,697,710 B2
(45) Date of Patent: Jun. 30, 2020

(54) MANUFACTURING METHOD OF THREE-DIMENSIONAL HEAT CONDUCTING STRUCTURE

(71) Applicant: COOLER MASTER CO., LTD., New Taipei (TW)

(72) Inventors: Chien-Hung Sun, New Taipei (TW); Lei-Lei Liu, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 115 days.

(21) Appl. No.: 16/107,877

(22) Filed: Aug. 21, 2018

(65) Prior Publication Data

US 2018/0356162 A1   Dec. 13, 2018

Related U.S. Application Data

(62) Division of application No. 14/794,028, filed on Jul. 8, 2015, now Pat. No. 10,077,946.

(30) Foreign Application Priority Data

May 25, 2015 (TW) .............................. 104116596 A

(51) Int. Cl.
| | |
|---|---|
| B23K 1/18 | (2006.01) |
| B23K 37/06 | (2006.01) |
| H01L 23/427 | (2006.01) |
| F28D 15/02 | (2006.01) |
| F28D 15/04 | (2006.01) |

(52) U.S. Cl.
CPC ............ *F28D 15/0275* (2013.01); *B23K 1/18* (2013.01); *B23K 37/06* (2013.01); *F28D 15/0266* (2013.01); *F28D 15/04* (2013.01); *F28F 2275/06* (2013.01); *H01L 23/427* (2013.01)

(58) Field of Classification Search
CPC ..... F28D 15/04; F28D 15/0266; B23K 37/06; B23K 1/18; H01L 23/427; F28F 2275/06
See application file for complete search history.

(56) References Cited

U.S. PATENT DOCUMENTS 6,738,257 B1 *   5/2004   Lai ..................... F28D 15/0266
                                                             165/104.26

* cited by examiner

*Primary Examiner* — Lee A Holly
(74) *Attorney, Agent, or Firm* — Maschoff Brennan

(57) ABSTRACT

A manufacturing method of a three-dimensional heat conducting structure, comprising: providing a vapor chamber having at least one insert hole; providing a heat pipe having an open end, and inserting the open end into the insert hole; providing a support ring, and sheathing the support ring on either the heat pipe or the vapor chamber, wherein the supporting ring extends along an axial direction of the heat pipe and has a contact surface facing toward an outer surface of the vapor chamber, and the contact surface is in contact with the outer surface of the vapor chamber; and providing a soldering means, and applying the soldering means between the support ring and the heat pipe to combine the heat pipe onto the vapor chamber.

5 Claims, 6 Drawing Sheets

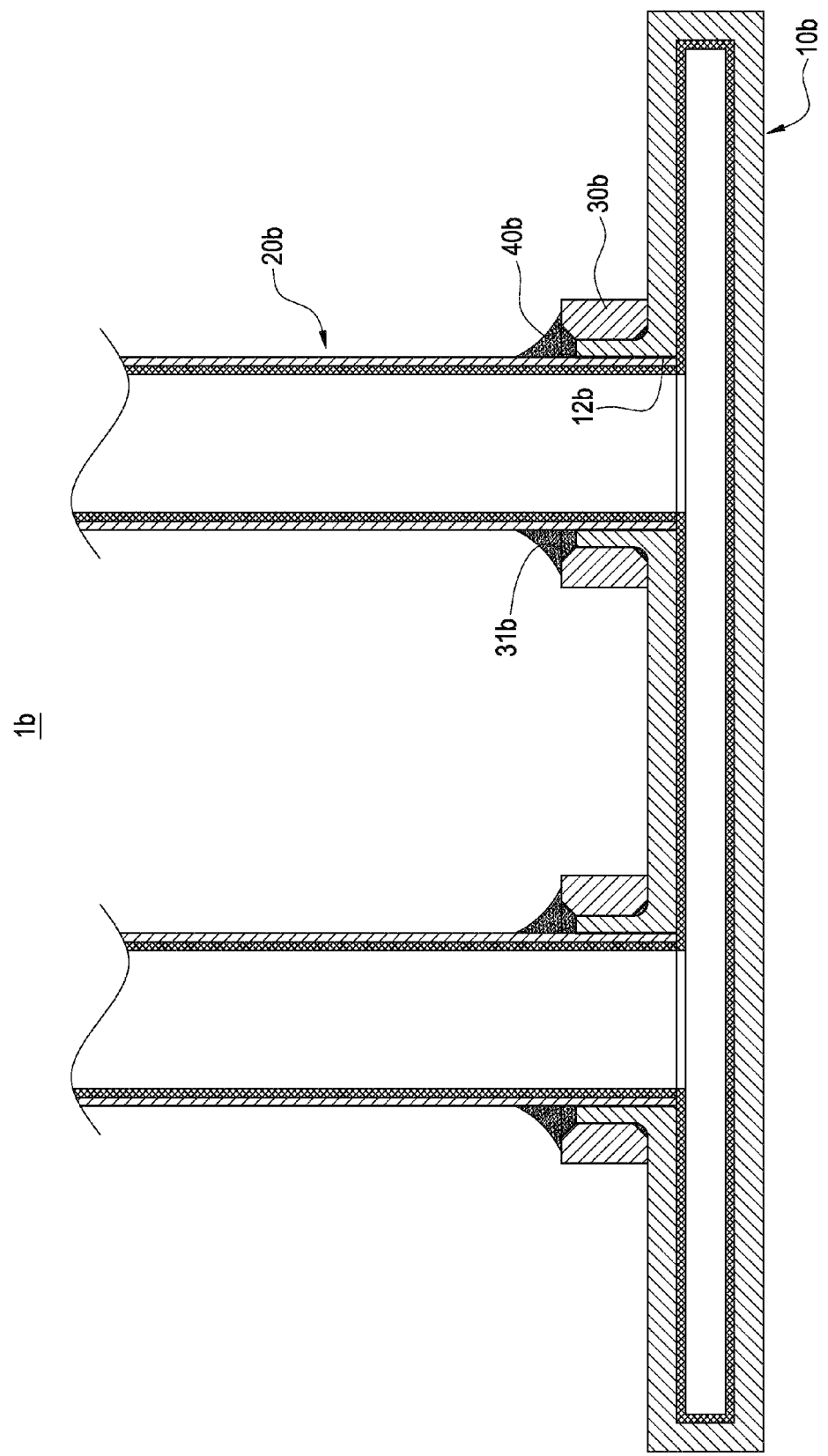

MANUFACTURING METHOD OF THREE-DIMENSIONAL HEAT CONDUCTING STRUCTURE

CROSS-REFERENCE TO RELATED APPLICATIONS

This is a divisional patent application of U.S. application Ser. No. 14/794,028 filed Jul. 8, 2015, which claims priority under 35 U.S.C. § 119(a) on Patent Application No(s). 104116596 filed in Taiwan, R.O.C. on May 25, 2015, the entire contents of which are hereby incorporated by reference.

TECHNICAL FIELD

The present invention relates to a heat conducting device, and more particularly to a three-dimensional heat conducting structure and its manufacturing method.

BACKGROUND

Vapor chamber or heat pipe is a high-performance heat conducting device for conducting a local heat source to other places. With the features of high thermal conductivity, light weight, simple structure, and multi-function, the vapor chamber and heat pipe can conduct a large quantity of heat without consuming electric power, so that the vapor chamber and heat pipe have been used extensively in the market of high-performance cooling components such as the server, communication, high-end graphic card, and high-efficiency LED cooling components.

In a conventional heat conducting structure, the heat pipe is combined to the vapor chamber to improve the heat conduction speed. In the aforementioned heat conducting structure, the heat pipe and the vapor chamber are combined by means of soldering. However, the melted solder may overflow to the desired combining position as well as other positions such as a surface of the vapor chamber, and thus affecting the combining effect of the soldering, resulting in an appearance defect, and reducing the product yield.

SUMMARY

Therefore, it is a primary objective of the present invention to provide a three-dimensional heat conducting structure and its manufacturing method to prevent the solder from overflowing to the surface of the vapor chamber, so as to improve the product yield.

To achieve the aforementioned and other objectives, the present invention provides a three-dimensional heat conducting structure, comprising a vapor chamber, at least one heat pipe, at least one support ring, and a solder. The vapor chamber comprises a casing, and at least one insert hole formed on a side of the casing and communicated with the casing; the heat pipe has an open end inserted into the insert hole and communicated to the interior of the casing; the support ring is sheathed on a joint position of the heat pipe and the vapor chamber, and a side of the support ring is attached onto an outer surface of the vapor chamber; and the solder is disposed between the support ring and the heat pipe and provided for combining the heatpipe onto the vapor chamber.

To achieve the aforementioned and other objectives, the present invention further provides a manufacturing method of a three-dimensional heat conducting structure, and the manufacturing method comprises the steps of: (a) providing a vapor chamber having at least one insert hole; (b) providing a heat pipe having an open end, and inserting the open end into the insert hole; (c) providing a support ring, and sheathing the support ring on a joint position of the heat pipe and the vapor chamber; and (d) providing a soldering means, and applying the soldering means between the support ring and the heat pipe to combine the heat pipe onto the vapor chamber.

Compared with the prior art, the three-dimensional heat conducting structure of the present invention has the support ring sheathed on the joint position of the heat pipe and the vapor chamber and provided for preventing the solder from overflowing to the surface of the vapor chamber to improve the product yield. Further, the support ring provides a supporting force to the combination of the heat pipe and the vapor chamber, so that the heat pipe is combined onto the vapor chamber more securely by the solder to enhance the practicality of the present invention.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIG. 6 is a cross-sectional view of a three-dimensional heat conducting structure in accordance with a third preferred embodiment of the present invention.

DETAILED DESCRIPTION

Figure 1:
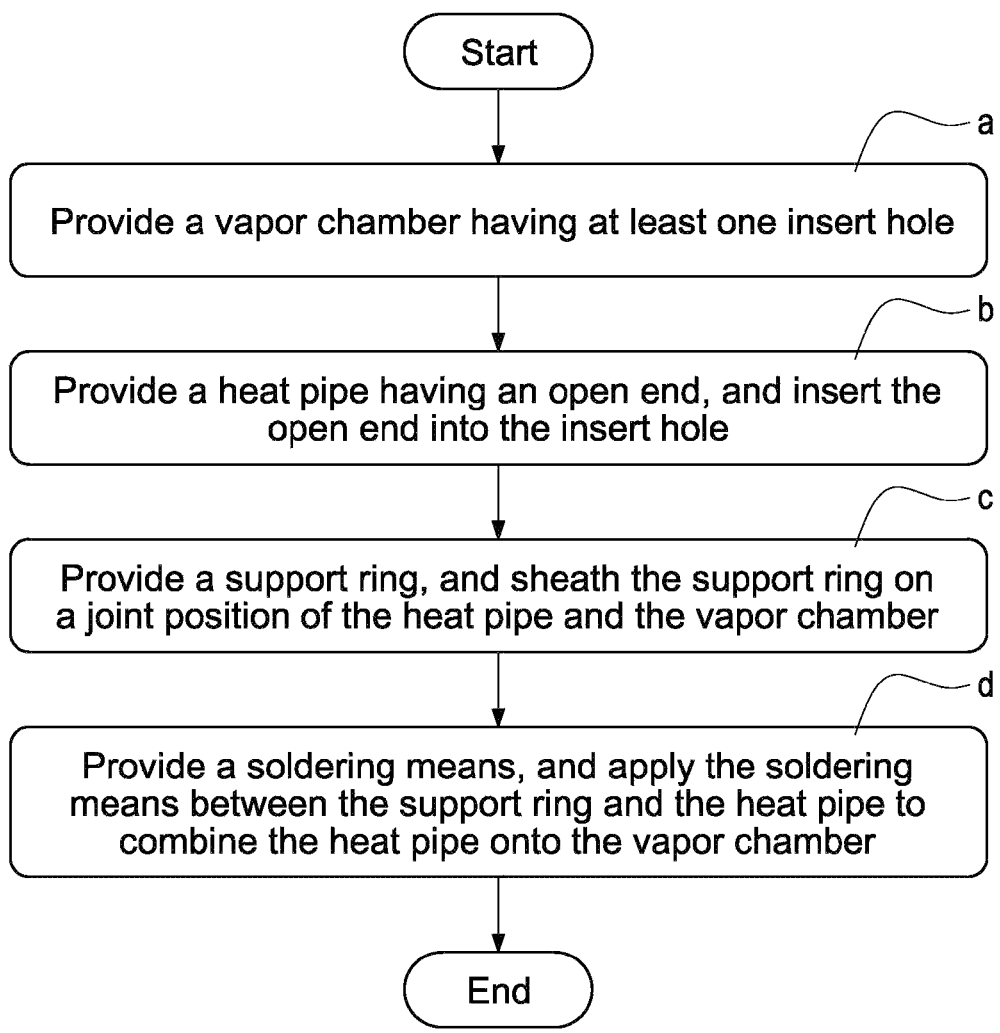
FIG. 1 is flow chart of a manufacturing method of a three-dimensional heat conducting structure of the present invention.

The technical contents of the present invention will become apparent with the detailed description of preferred embodiments accompanied with the illustration of related drawings as follows.

With reference to FIGS. 1 to 4 for a manufacturing flow chart, an exploded view, a perspective view and a cross-sectional view of a three-dimensional heat conducting structure of the present invention respectively, the manufacturing method of a three-dimensional heat conducting structure comprises the steps of: providing a vapor chamber 10 having at least one insert hole 12 (Step a); providing a heat pipe 20 having an open end 21, and inserting the open end 21 into the insert hole 12 (Step b); providing a support ring 30, and sheathing the support ring 30 on a joint position of the heat pipe 20 and the vapor chamber 10 (Step c); and providing a soldering means, and applying the soldering means between the support ring 30 and the heat pipe 20 for combining the heat pipe 20 onto the vapor chamber 10.

Figure 2:
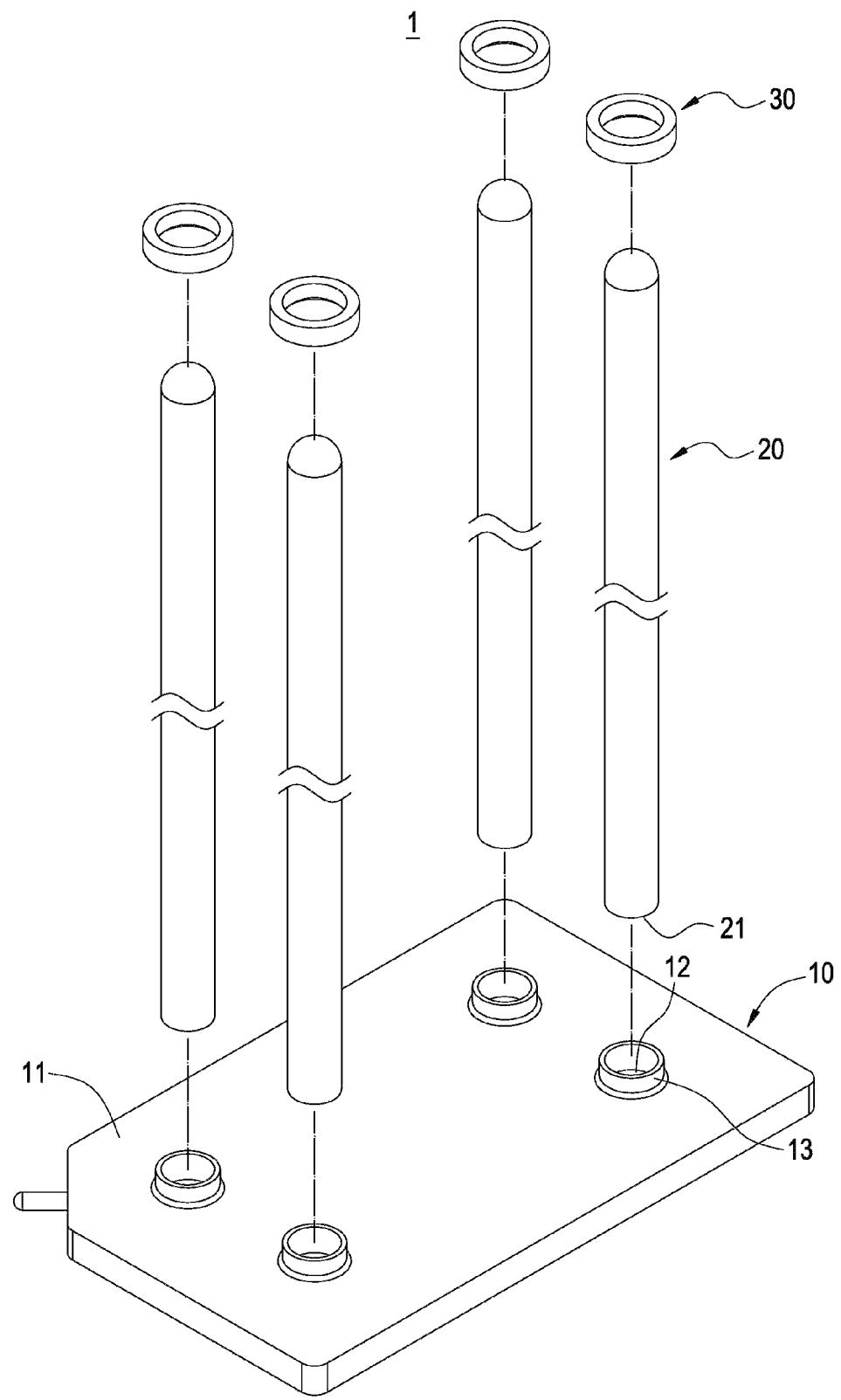
FIG. 2 is an exploded view of a three-dimensional heat conducting structure of the present invention.

With reference to FIG. 2 for a three-dimensional heat conducting structure 1 of the present invention, the three-dimensional heat conducting structure 1 comprises a vapor chamber 10, at least one heat pipe 20, a support ring 30, and a solder 40. The support ring 30 is sheathed on the heat pipe 20 and disposed at a joint position of the heat pipe 20 and the vapor chamber 10, and the heat pipe 20 is combined to the vapor chamber 10 by the solder 40, and the detailed structure will be described later.

The vapor chamber 10 includes a casing 11, and at least one insert hole 12 formed on a side of the casing 11 and communicated with the interior of the casing 11. In a preferred embodiment of the present invention, the vapor chamber 10 further includes a capillary structure 14 and a working fluid (not shown in the figure) disposed at the interior of the casing 11.

The heat pipe 20 is a hollow metal pipe capable of conducting heat quickly and uniformly without requiring electric power supply. The heat pipe 20 has an open end 21, and the open end 21 is inserted into the insert hole 12 and communicated with the interior of the casing 11. In practice, the number of insert holes 12 of the vapor chamber 10 is equal to the number of heat pipes 20. In this embodiment, the heat pipe 20 includes a cover 22 and a capillary layer 23. The capillary layer 23 is located inside the cover 22, and the cover 22 has the open end 21. When the heat pipe 20 is inserted into the insert hole 12, both the cover 22 and the capillary layer 23 are surrounded by the insert hole 12.

In addition, the support ring 30 is a ring made of metal (such as copper), or heat resistant non-metal (such as ceramic). The support ring 30 is sheathed on a joint position of the heat pipe 20 and the vapor chamber 10, and a side of the support ring 30 is attached onto an outer surface of the vapor chamber 10.

Figure 3:
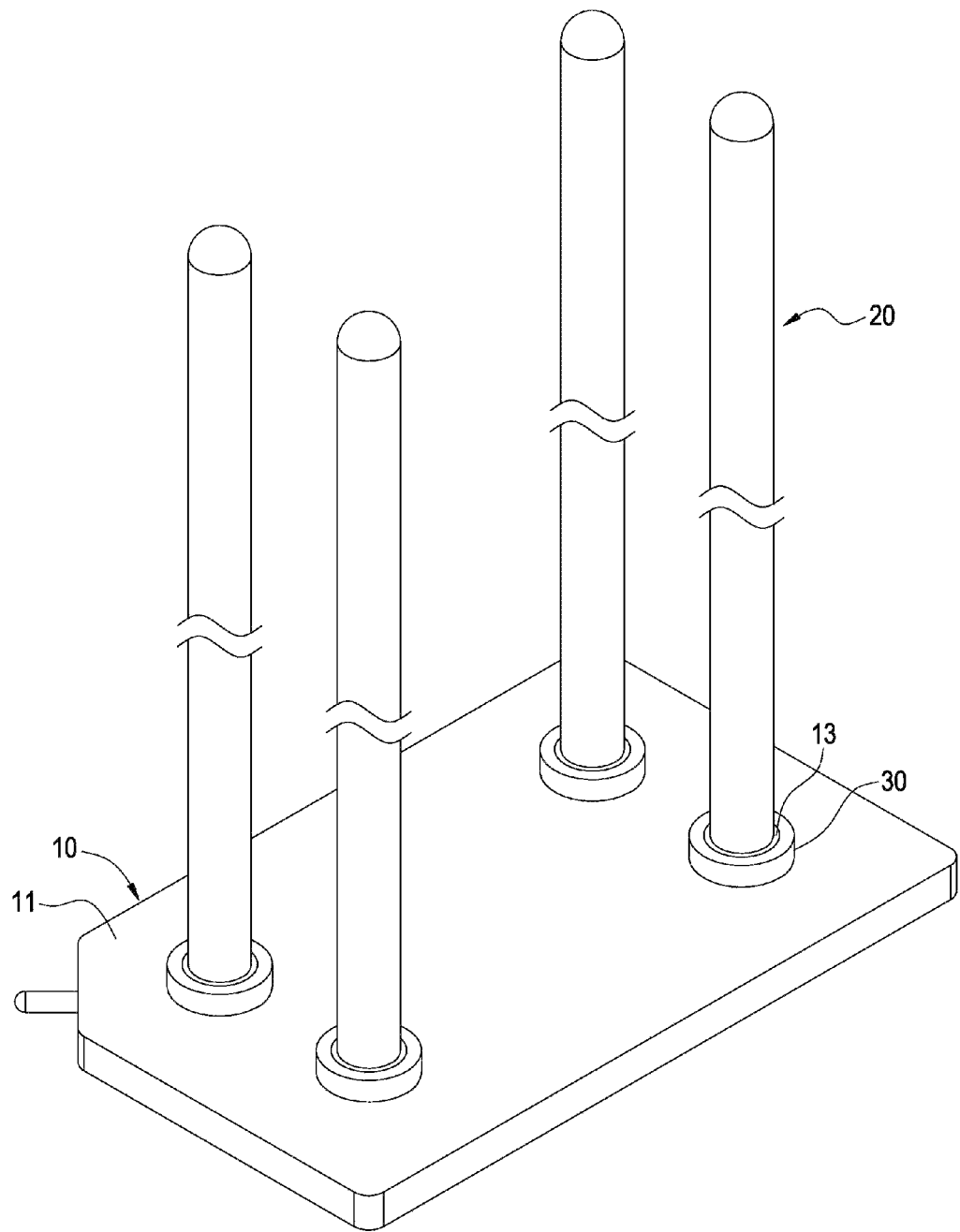
FIG. 3 is a perspective view of a three-dimensional heat conducting structure of the present invention.
Figure 4:
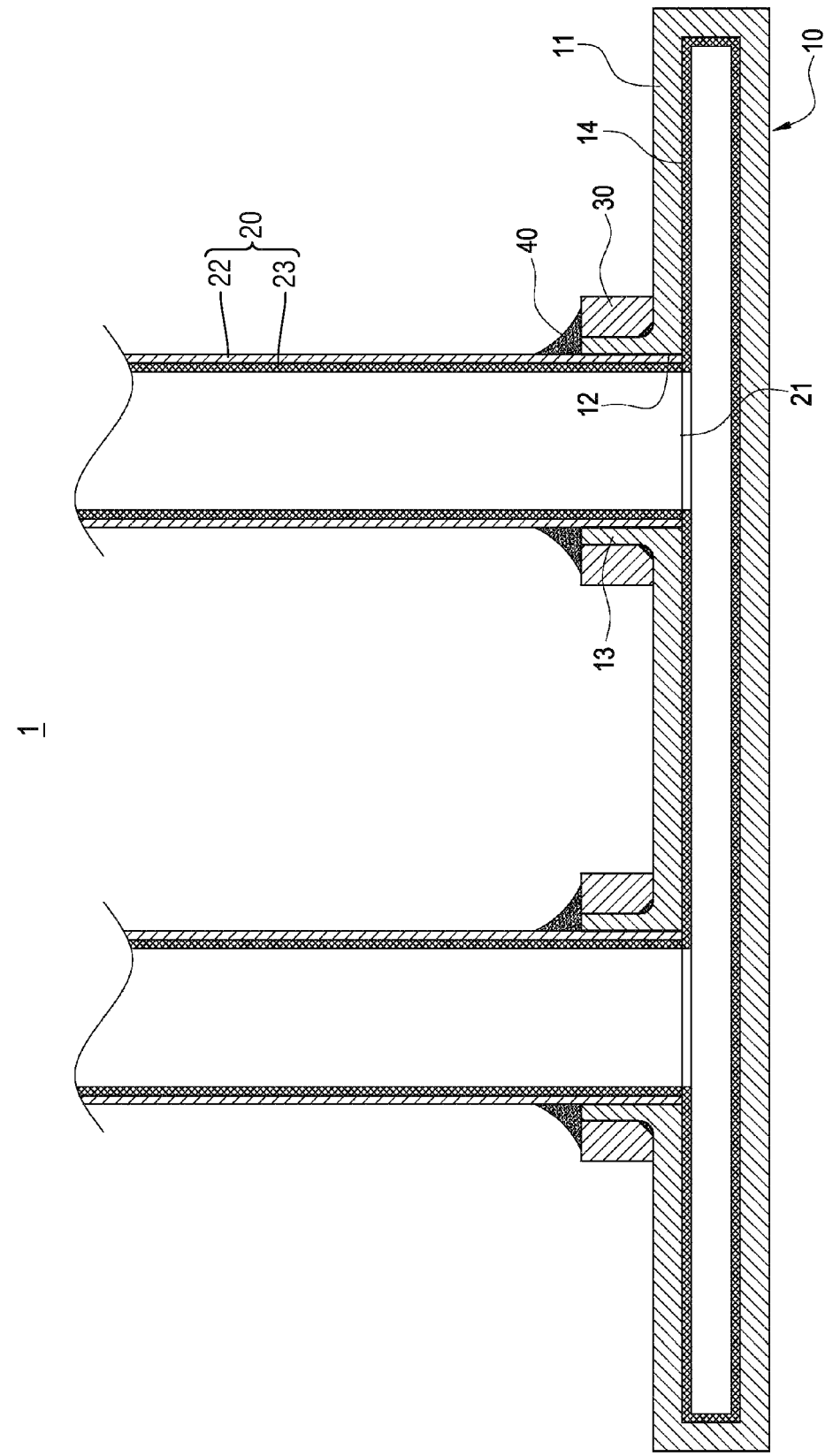
FIG. 4 is a cross-sectional view of a three-dimensional heat conducting structure in accordance with a first preferred embodiment of the present invention.

In FIG. 3, after the support ring 30 is sheathed on the outer side of the heat pipe 20, the solder 40 is placed and soldered between the support ring 30 and the heat pipe 20 to combine the heat pipe 20 onto the vapor chamber 10 by the solder 40, and the support ring 30 is provided for preventing the solder 40 from overflowing to a surface of the vapor chamber 10 to improve the product yield. It is noteworthy that the present invention is not limited to the use of the solder 40 only, but other means such as a solder ring, a solder strip, a solder, or a solder paste may be used instead.

Preferably, in Step (a), the vapor chamber 10 has a rim 13 formed around the periphery of the insert hole 12 and protruded from an outer surface of the vapor chamber 10 outer surface, and an inner wall surface of the rim 13 is attached to an outer surface of the heat pipe 20. In Step (b), an inner wall surface of the support ring 30 is attached on an outer wall surface of the rim 13. The rim 13 is provided for giving a better positioning effect of inserting the heat pipe 20 into the insert hole 12 in order to have a better combination of the heat pipe 20 and the vapor chamber 10, so as to improve the yield of the three-dimensional heat conducting structure 1.

It is noteworthy that the solder is applied after the support ring 30 is sheathed on the outer side of the heat pipe 20, and the support ring 30 provides a supporting force for the combination of the heat pipe 20 and the vapor chamber 10, so that the heatpipe 20 is combined onto the vapor chamber 10 securely by the solder 40.

Figure 5:
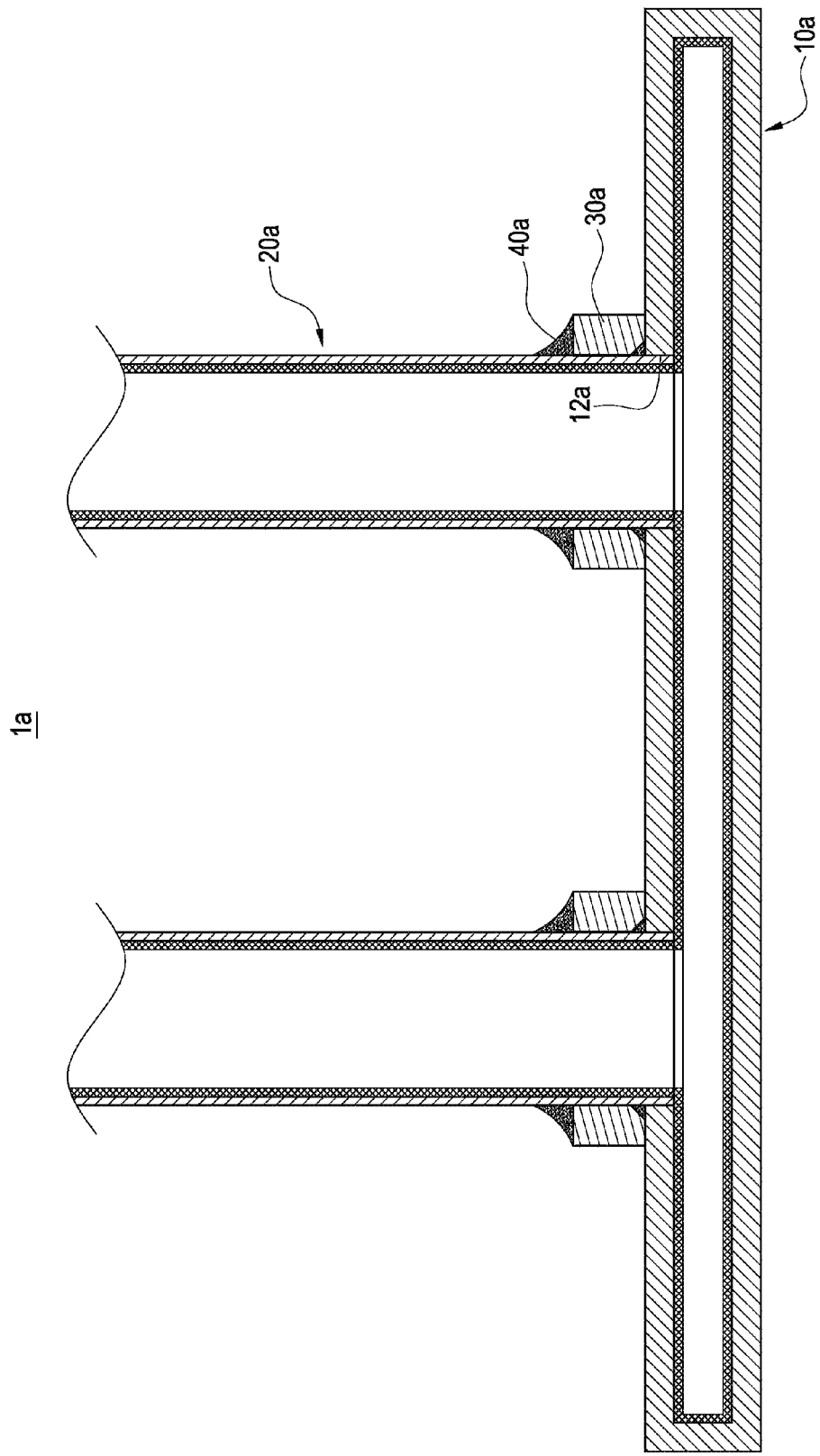
FIG. 5 is a cross-sectional view of a three-dimensional heat conducting structure in accordance with a second preferred embodiment of the present invention.

With reference to FIG. 5 for a cross-sectional view of a three-dimensional heatconducting structure 1a in accordance with a second preferred embodiment of the present invention, this preferred embodiment is substantially the same as the first preferred embodiment, and the three-dimensional heat conducting structure 1a comprises a vapor chamber 10a, at least one heat pipe 20a, a support ring 30a and a solder 40a. The vapor chamber 10a has an insert hole 12a, and an end of the heatpipe 20a is inserted into the insert hole 12a. In addition, the support ring 30a is sheathed on the heat pipe 20a and disposed at a joint position of the heat pipe 20a and the vapor chamber 10a. In addition, the heat pipe 20a is combined onto the vapor chamber 10a by the solder 40a.

The difference between this preferred embodiment and the first preferred embodiment resides on that the vapor chamber 10a does not have any rim formed around the periphery of the insert hole 12, and the support ring 30a is sheathed on the heat pipe 20a directly. In other words, the inner wall surface of the support ring 30a is attached on the external peripheral surface of the heat pipe 20a. Similarly, the solder 40a is disposed between the support ring 30a and the heat pipe 20a, and the heat pipe 20a is combined to the vapor chamber 10a by the solder 40a.

It is noteworthy that the support ring 30a of this preferred embodiment is unlike the rim structure of the vapor chamber 10a and the difference resides on that the support ring 30a is not formed directly from the vapor chamber 10a, so that the shape and size of the support ring 30a may be designed or changed according to the actual using requirements. The support ring 30 is provided for giving a better supporting force for the combination of the heat pipe 20a and the vapor chamber 10a. In addition, the support ring 30a is provided for preventing the solder 40a from overflowing to the surface of the vapor chamber 10a to provide a better combining effect.

With reference to FIG. 6 for a cross-sectional view of a three-dimensional heatconducting structure 1b in accordance with a third preferred embodiment of the present invention, this preferred embodiment is substantially the same as the first preferred embodiment, and the three-dimensional heat conducting structure 1b comprises a vapor chamber 10b, at least one heat pipe 20b, a support ring 30b, and a solder 40b. The vapor chamber 10b has an insert hole 12b, and an end of the heatpipe 20b is inserted into the insert hole 12b. In addition, the support ring 30b is sheathed on the heat pipe 20b and disposed at a joint position between the heat pipe 20b and the vapor chamber 10b, and the heat pipe 20b is combined to the vapor chamber 10b by the solder 40b.

The difference between this preferred embodiment and the first preferred embodiment resides on that the support ring 30b has a chamfer 31b disposed on a side adjacent to the heat pipe 20b, so that the solder 40b stays between the chamfer 31b and the outer surface of the heat pipe 20b without overflowing to the surface of the vapor chamber 10b, so as to provide a better combining effect.

While the invention has been described by means of specific embodiments, numerous modifications and variations could be made thereto by those skilled in the art without departing from the scope and spirit of the invention set forth in the claims.

What is claimed is:

1. A manufacturing method of a three-dimensional heat conducting structure, comprising:
   Step (a) providing a vapor chamber having at least one insert hole;
   Step (b) providing a heat pipe having an open end, and inserting the open end into the insert hole;
   Step (c) providing a support ring, and sheathing the support ring on either the heat pipe or the vapor chamber, wherein the supporting ring extends along an axial direction of the heat pipe and has a contact surface facing toward an outer surface of the vapor chamber, and the contact surface is in contact with the outer surface of the vapor chamber; and Step (d) providing a soldering means, and applying the soldering means between the support ring and the heat pipe to combine the heat pipe onto the vapor chamber.

2. The manufacturing method of a three-dimensional heat conducting structure as claimed in claim 1, wherein in Step (a), the vapor chamber has a rim formed around the periphery of the insert hole and protruded from the outer surface of the vapor chamber.

3. The manufacturing method of a three-dimensional heat conducting structure as claimed in claim 2, wherein in Step (c), the support ring is sheathed on the rim of the vapor chamber, and an inner wall surface of the support ring is in contact with an outer wall surface of the rim.

4. The manufacturing method of a three-dimensional heat conducting structure as claimed in claim 1, wherein in Step (c), the support ring has a chamfer disposed on a side adjacent to the heat pipe.

5. The manufacturing method of a three-dimensional heat conducting structure as claimed in claim 4, wherein in Step (d), the soldering means includes a solder, and the solder stays between the chamfer and an outer surface of the heat pipe without overflowing to a surface of the vapor chamber.

* * * * *